United States Patent [19]

Gürich

[11] Patent Number: 4,712,036
[45] Date of Patent: Dec. 8, 1987

[54] PRESSURE TRANSDUCER HAVING A PIEZOELECTRIC ELEMENT FOR PRESSURE MEASUREMENTS AT HIGH TEMPERATURES PARTICULARLY FOR THE COMBUSTION CHAMBER PRESSURE OF INTERNAL COMBUSTION ENGINES

[75] Inventor: Gunter L. Gürich, Aachen, Fed. Rep. of Germany

[73] Assignee: FEV Forschungsgesselschaft für Energie-Technik und Verbrennungsmotoren mbH, Aachen, Fed. Rep. of Germany

[21] Appl. No.: 942,402

[22] Filed: Dec. 16, 1986

[30] Foreign Application Priority Data

Dec. 21, 1985 [DE] Fed. Rep. of Germany ....... 3545682

[51] Int. Cl.$^4$ ............................................ H01L 41/08
[52] U.S. Cl. ...................................... 310/333; 310/338
[58] Field of Search ............... 310/338, 329, 333; 73/517 R, 517 A, DIG. 4, 700, 708, 715, 723, 724, 744, 745, 753, 754

[56] References Cited

U.S. PATENT DOCUMENTS

| | | | |
|---|---|---|---|
| 4,052,628 | 10/1977 | Mayer | 310/333 |
| 4,072,871 | 2/1978 | Wilson | 310/333 |
| 4,180,892 | 1/1980 | Jensen | 310/333 X |
| 4,211,951 | 7/1980 | Jensen | 310/333 X |
| 4,503,351 | 3/1985 | Sonderegger et al. | 310/329 |
| 4,519,254 | 5/1985 | Sonderegger et al. | 310/338 X |

FOREIGN PATENT DOCUMENTS 2906451 7/1980 Fed. Rep. of Germany ...... 310/338

OTHER PUBLICATIONS

Publication–"State-of-the-Art Measurements in Combustion Engines", U. Dübendorfer, P. Wolfer, ISA Transactions, vol. 24, No. 2, pp. 35–38, 1985.

Primary Examiner—Mark O. Budd
Attorney, Agent, or Firm—Watson, Cole, Grindle & Watson

[57] ABSTRACT

A pressure transducer for measuring the internal combustion chamber pressure of an internal combustion engine includes a pair of piezoelectric flat plates loaded in shear mode on opposite sides of a central stamp element connected to the plunger of a pressure responsive membrane, pressure distribution elements bearing externally on the piezoelectric plates, abutment elements bearing externally on the pressure distribution elements, and a prestress spring surrounding the abutment elements and applying compressive forces to the distribution elements and for retaining the piezoelectric plates in place. And, the abutment elements are connected to the housing such that the axial force exerted against the stamp element by the pressure to be measured exerts a thrust on both piezoelectric plates which thrust is absorbed by the abutment elements and transferred to an end of the housing confronting the pressure to be measured.

8 Claims, 7 Drawing Figures

PRESSURE TRANSDUCER HAVING A PIEZOELECTRIC ELEMENT FOR PRESSURE MEASUREMENTS AT HIGH TEMPERATURES PARTICULARLY FOR THE COMBUSTION CHAMBER PRESSURE OF INTERNAL COMBUSTION ENGINES

BACKGROUND OF THE INVENTION

This invention relates to pressure transducers having a piezoelectric element for pressure measuring at high temperatures, particularly for the combustion chamber pressure of internal combustion engines, in which the combustion chamber pressure is measured by deformation of the piezoelectric element or elements.

The pressure measurement in internal combustion engines has been, since the early stages of engine development, one of the most important aids in the evaluation of combustion. The pressure is a state variable of the thermodynamic processes in the engine. Thus, the measuring of pressure has increasing importance in the operational monitoring of large diesel engines. Typically, a pressure measuring device of robust construction was required so that, even without forced cooling, long lay-up times are attained. In addition, such pressure measuring devices should be high - temperature independent with respect to the signal transmission factor, insensitive to temperature shock and protected against excessively high temperatures.

Force-cooled pressure measuring devices for thermodynamic investigations have long been used for pressure measurement in internal combustion engines. The piezoelectric measuring technique, employing a pressure transducer having a quartz-monocrystal, now enjoys widespread use. However, such transducer are subjected to high mechanical and thermal and especially shock stresses during combustion in the combustion chamber. Most attempts at improvements have thus been directed to compensating for such stress, to the pressure responsive membrane, its attachments, the piezoelectric measuring element and the materials employed.

The limited life span of cooled pressure measurement devices, the difficulty in handling and other factors are decisive in the development of uncooled pressure measuring devices, including those having piezoelectric elements. Cooled pressure measuring devices, having longitudinal or transverse mode of loading the quartz are described, for example, by Dubendorfer, U. and Wolfer, P. in a publication entitled "State-of-the-Art Pressure Measurments in Combustion Engines" in ISA Transactions, Volume 24, Number 2, 1985 Pages 35 to 38.

SUMMARY OF THE INVENTION

It is an object of the present invention to provide an uncooled type of pressure measuring device for use under high temperature conditions in the combustion chamber of an internal combustion engine, which largely satisfies the requirements and presents other advantages compared to known pressure measuring devices.

According to the invention, the pressure measuring device, or pressure transducer, has at least two piezoelectric flat plates loaded in shear mode and arranged on both sides of the central stamp element, pressure distribution elements bearing externally on the plates, abutment elements bearing externally on the pressure distribution elements, and a prestressed spring element, preferably an annular bent spring, surrounding the abutment members for applying compressive forces to the pressure distribution elements and for retaining the plates in place. The abutment elements are connected to the housing, such that the axial force exerted against the stamp element by the pressure to be measured exerts a thrust on both piezoelectric plates which thrust is absorbed by the abutment element and transferred to the housing. Moreover, the piezoelectric elements are maintained at constant compression so as to be independent of temperature and of the force to be measured which is a function of the prevailing pressure within the combustion chamber to be measured.

Other objects advantages and novel features will become more apparent from the following detailed description when taken in conjunction with the accompanying drawings.

DETAILED DESCRIPTION OF THE INVENTION

Figure 1:
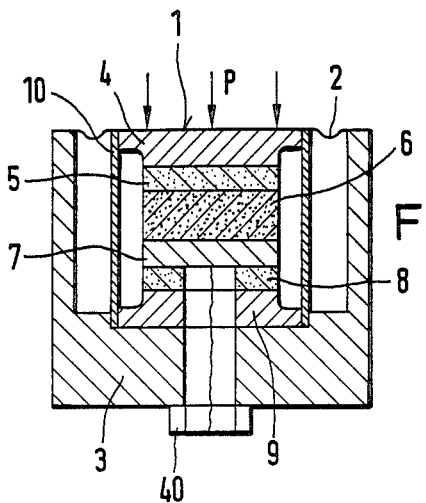
FIG. 1 is a schematic view of a prior art pressure transducer having piezoelectric flat plates loaded in longitudinal mode.

Turning now to the drawings wherein like reference characters refer to like and corresponding parts throughout the several views, FIG. 1 shows a prior art pressure transducer, the pressure acting on surface 1, having a pressure responsive membrane 2 attached to one end of pressure transducer housing 3 mounted in a known manner within the combustion chamber of an I.C.E. The membrane includes a plunger 4 provided with a thermal and electrical insulating layer 5 overlying a flat piezoelectric plate or stacked plates 6 beneath which an electrode 7 is located, another electrically insulating layer 8 and a pressure plate 9. The membrane is exposed the pressure to be measured such that the pressure P exerts force against the piezoelectric element which converts the force into a proportional electrical signal. An annular prestressed spring 10 holds the subassembly parts 4 to 9 together under a compressive force to reduce split resiliency and to obtain high frequency.

The construction of measuring plates 6 varies in two transducer types. With the pressure plates loaded in longitudinal mode, as in FIG. 1, several monocrystal discs of X-cut quartz are usually stacked and electrically connected in such a manner that the applied force has the same effect on each of the discs, and the electrical charge is measured and added on all surfaces perpendicular to the force direction. Electrode 7 and electrode lead lines transmit the signal to a miniature plug 40. The quartz disks are mechanically aligned in a row and are electrically parallel. The transmission factor is multiplied according to the number of quartz discs. And, the electrical insulation layers 5 and 7 can be replaced by suitable construction of the quartz discs.

Figure 2:
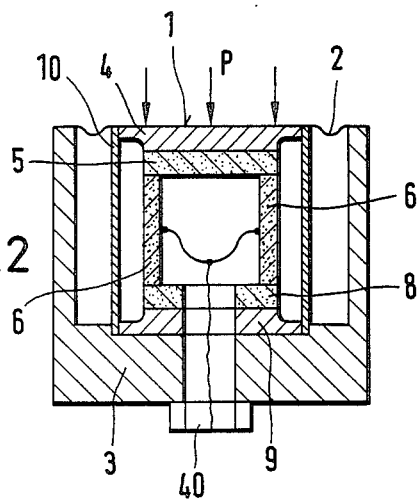
FIG. 2 is a schematic view of a prior art pressure transducer having piezoelectric flat plates loaded in transverse mode.

In the transverse mode the electrical charges are recorded on surface parallel to the force direction, as in FIG. 2. Compared to the longitudinal mode, the signal transmission factor of the piezoelectric measuring plates 6 depends on the geometric dimension of the crystal quartz disc. By suitable choice of the dimensions it is possible to increase the charge yield within limits, corresponding to about ten quartz discs in longitudinal mode. The use of several discs is limited, for mechanical reasons, to mechanically parallel switched discs, as indicated in FIG. 2 by two piezoelectric flat plates 6, so that the signal transmission factor with electrical parallel switching does not change. In the transverse mode transducer of FIG. 2, a quartz crystal cut (xyt) 155° is generally used. Compared to the x-cut for the longitudinal mode, the signal transmission factor for this cut is temperature compensated, i.e. it changes only by about +1% in a temperature range of about 550 K. Moreover this crystal cut has a higher resistance against the so-called "twin-formation" under pressure tension compared to the x-cut, which is a detrimental transformation of the crystalline structure for measuring. For this reason, the transverse mode for uncooled pressure transducers at high temperatures up to 600 K is more suitable than the longitudinal mode.

However, both of the aforedescribed known transducer types have a number of disadvantages. For example, short term overheating usually leads to a change in properties in the quartz crystal by "twin-formation". The piezoelectric coefficients of quartz are relatively small, the heat flow generally passes through the crystal and prestressed spring and thus causes considerable temperature gradients. The prestressed spring, which is required for faultless operation of the piezoelectric transducer, represents an external force by-pass to the measuring element, and constitutes very critical element in production and installation. Any change, non-linearity, etc. of the prestressed spring in FIGS. 1 and 2 has the same effect as a change of the measuring value or non-linearity of the transducers. The influence of thermal expansion under high temperature conditions can only be compensated to a limited extent, as temperatures and temperature gradients in a prestressed spring and in layer 5, in FIGS. 1 and 2, are never fully the same. And, the influence of the housing and the production tolerances on the properties of the transducer are factors to be contended with.

Because of the known disadvantages of the conventional, uncooled pressure transducers for internal combustion engines, it is desireable to develop a pressure transducer other than the force-cooled type for measuring the pressure of a combustion chamber of an internal combustion engine with high precision and high reliability.

Figure 3:
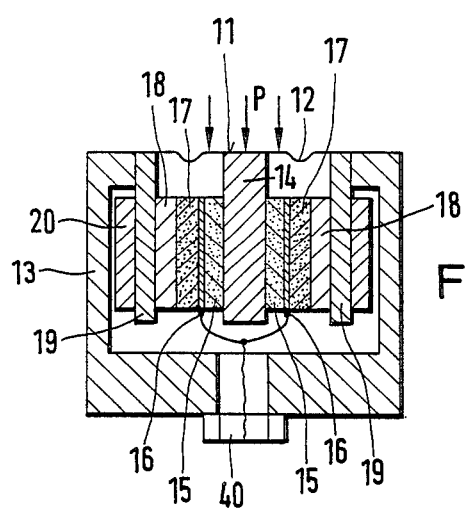
FIG. 3 is a schematic view of a pressure transducer according to the invention.

FIG. 3 schematically illustrates a pressure transducer according to the invention having a pair of parallel switched, piezoelectric flat plates loaded in shear made for measuring the combustion chamber pressure of an internal combustion engine. A membrane 12, facing a pressure P to be measured acting against its pressure measuring surface 11, is attached or welded to one end of the transducer housing 13 for sealing the housing against the combustion chamber (not shown) a force lead 14, known as a stamp, is connected to the membrane. The pressure force is transmitted through the stamp to a pair of measuring elements located laterally on opposite sides of stamp 14. Each measuring element includes a joining layer 15 of electrical insulation material, and electrode 16 for transmitting electrical signals, a piezoelectric flat plate 17 loaded in shear mode, and an external pressure distribution element 18. Abutment elements 19 absorb the pressure force applied to stamp 14 and transfer that force to housing 13. The measuring elements are employed for thrust by the measuring force.

A preferably annular prestressed spring 20 is provided for holding the pair of measuring elements together. The spring may be a stiff solid structure having the required spring characteristics. It is, however, likewise possible to arrange abutments 19 as prestressed springs for space-saving purposes. Nevertheless, it is suitable to retain the functions of the prestressed spring 20 and the abutments 19 as shown in FIG. 3 since the prestressed spring is so arranged as to be independent of the measuring force. Alternatively, a prestressed spring may be provided in the form of an internal spring part such that stamp 14 could be axially split for exerting radially outwardly resilient forces against the laterally disposed measuring elements. A partially split stamp 14 can therefore be employed as a spring. However, prestressing should preferably be carried out during installation by deformation or by a splitting tool.

Also, insulation layers 15 can be replaced by crystals so that by suitable orientation of the crystal cuts and the appropriate electrical parallel switching, the signal transmission factor may be doubled. Moreover, insulation layers 15 and plates 17 may be exchanged so as to respectively lie outwardly and inwardly of electrodes 16. And, with suitable construction, pressure distribution elements may be eliminated.

With such an arrangement, the prestressed spring does not create a power by-pass to the measuring elements, so that it has no influence on the measuring force. The spring is located outside the measuring force flow, and for this purpose the spring element, which is held in place by its prestressed force, is only connected to abutments 19, and may be in the form of a shrunk ring, a bent ring spring, pressure pieces with expansion screws, a flexible hoop with screws, etc.

The cross-sensitivity of the FIG. 3 pressure transducer in the directions of the shear axis and the prestress can be substantially reduced by the suitable combination of several like crystals with suitable orientation and switching. With the optimization of the crystal cut, the cross-sensitivity can thus be disregarded.

The influence by the housing on the measuring force can be reduced since abutments 19 and stamp 14 are connected on the pressure side to housing 13 and membrane 12. Thus, heat flow through the transducer and through the prestressed spring is considerably reduced if the dimensions and material are accordingly selected. Moreover, with the present arrangement, the forces which can be created by thermal expansion in stamp 14 and abutments 19 are considerably reduced if the dimensions and materials are accordingly selected.

The prestressed spring is of simple construction, and spring manufacturing tolerances have only insignificant influences on the measuring force.

The pressure transducer of the invention likewise depends on a suitable piezoelectric material and on the crystal cut. Other than the use of quartz crystals only a few other crystals can be considered because of the high temperature conditions. As a monocrystal material, lithium niobate is preferred because of its high Curie temperature, good mechanical and piezoelectric properties and low temperature dependency as well as the stability of its properties. Other monocrystals can be used, such as tourmaline and lithium tantalate.

In carrying out the invention, lithium niobate crystal material having a cut $(xyt)\chi = 22°$ to $22.5°$ is preferred. For this crystal cut, the signal transmission factor when loaded in shear mode is considerably higher compared to the quartz crystal materials employed in the FIG. 1 and FIG. 2 prior art pressure transducers. Other important properties of the crystal employed in carrying out the invention are: the transmission factor for pressure force is about equal to zero, thus no influences by prestress changes or non-linearity of the prestressed spring appear in the measuring value, the cross-sensitivity of the transducer in such direction being about equal to zero; the pyroelectric coefficient is about equal to zero, thus it does not promote temperature related measuring signals; the linear temperature coefficient of the transfer factor is about equal to zero, thus in a wide temperature range up to 550 K, systematic relative measuring errors are less than $+1\%$ of the measuring value; temperature overload capability of the crystal is up to 1000 K for a short interval, and possibly even higher; a quasi-static calibration at room temperature is possible and reliable up to more than 550 K.

For the transmission of electrical signals from the piezoelectrical crystals, the electrodes are provided on one of the flat sides thereof and can be applied by the thin-layer technology, particularly by sputtering or vaporization, or by thick-layer technology.

In practice, pressure transducers according to the invention may be in accordance with that shown in FIGS. 4 to 7. The interior pressure of the combustion chamber to be measured acts on a measuring surface 21 of a membrane 22 attached to transducer housing 23 for transferring the measuring force through its plunger 22a to a power conducting element 24, known as a stamp. Thus, the force is produced via two parts, namely, the plunger of the membrane and the stamp. As shown, each of these two parts has an annular external ring respectively located on opposite sides of an internal projection on abutment 29, so as to thereby protect against an overload condition, and for maintaining the parts assembled together. And, the parts are interconnected by a threaded connection T. The pressure force stamp 24 exerts a thrust on the measuring elements located on opposite sides of the stamp, which thrust is absorbed by abutments 29 and transferred to housing 23. The measuring elements comprise electrically insulating layers 25, electrodes 26, piezoelectric flat plates 27 loaded in shear mode and external force distribution elements 28. Layers 25 may comprise quartz glass discs having the same external dimensions as piezoelectric plates 27 and can be replaced by such plates. Electrodes 26 may comprise special expansion alloys. Electrode lead wires (not shown) are welded to the electrodes and are connected to a pin 42 of a conventional miniature plug. The preferred crystal cut of lithium niobate is employed for piezoelectric plate 27, as described with reference to FIG. 3.

Figure 4:
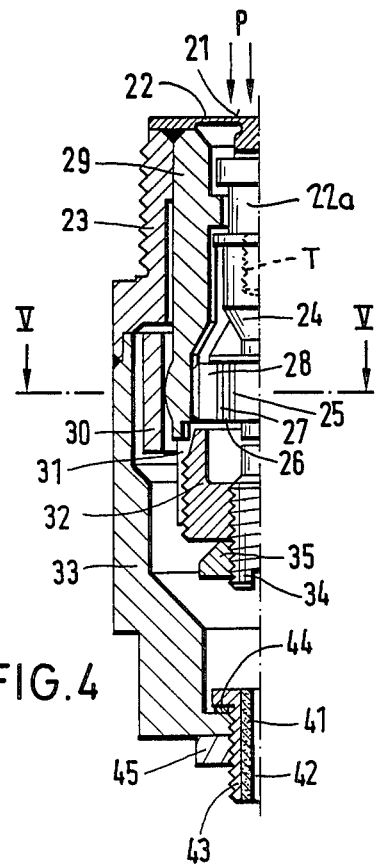
FIG. 4 is a left half longitudinal sectional view of a piezoelectric pressure transducer according to the invention.
Figure 7:
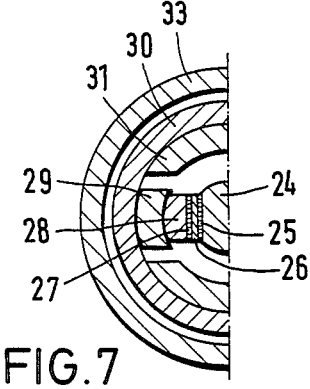
FIG. 7 is a sectional view taken substantially along the line 7—7 of FIG. 6.
Figure 5:
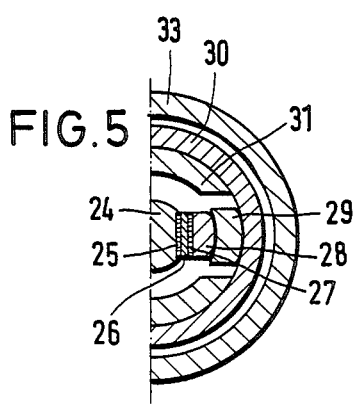
FIG. 5 is a right-half sectional view taken substantially along the line V—V of FIG. 4.
Figure 6:
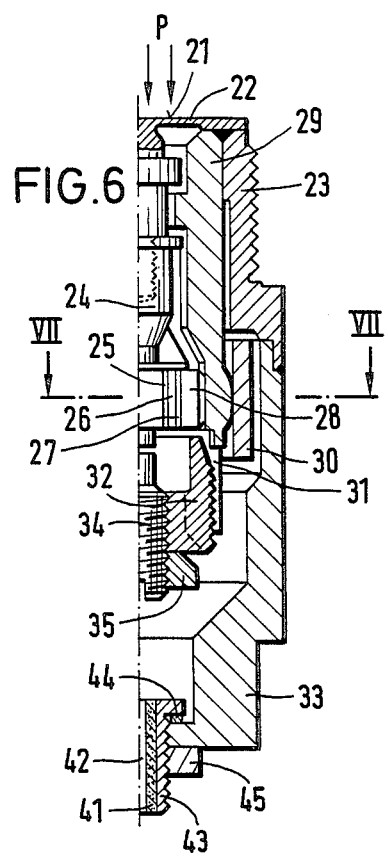
FIG. 6 is a right-half longitudinal sectional view of another embodiment of the pressure transducer according to the invention.

The measuring elements are prestressed by the provision of an annular prestressed spring 30 which may be formed as an annular bent spring during installation in order to achieve long spring paths. The prestress force exerted by the spring is concentrated at the relatively narrow outer contact surfaces of the abutments 29 having a little smaller radius than the prestress spring in order to reduce edge pressure and other force effects on piezoelectric plates 27 and on insulating layers 25, as shown in FIGS. 4 and 5. Otherwise, the outer surfaces of the abutments may be rounded as shown in one direction (FIG. 4) and contoured in the other direction (FIG. 7) to match the shape of the spring, so that the prestress force is exerted along tangential lines at the junctions between the spring and abutments 29. Otherwise, the outer surfaces of the abutments may be cylindrically shaped in one direction (FIG. 6) and contoured in the other direction (FIG. 7) to match the confronting contour of the spring, in order to assure an even force distribution by the spring. For the same reasons the inner surfaces of the abutments may be matched to the outer surfaces of the pressure distribution elements (FIG. 4, FIG. 7). In the FIGS. 4,5 embodiment, the prestress force and the measuring force are transmitted essentially linearly between abutments 29 and pressure distribution elements 28 the contact surfaces having different radii. Otherwise, the outer surfaces of the pressure distribution elements may be spherical to effect a point abutment and forces transmission. However, since the measuring force should exert a shear stress on the measuring elements, such a point force transmission is less desirable.

Elements 28 may be of ceramic materials, such that insulation layers 25 and electrodes 26 can be eliminated for space saving purposes. In such an arrangement, thick layer electrodes would be mounted on the ceramic surfaces and the electrode lead wires welded to the electrodes for transmission of the signals.

In order to adjust the prestress of the spring, tension tongues 31 may be provided so as to be pressed against the inner surface of the spring by a tension nut 32 which may have a conical surface for further stressing the adjoining prestressed spring. Also, an adjustable overload bolt 34 may be provided for limiting the axial movement of stamp 24. A counternut 35 fixes the axial location of bolt 34 and is suitable for clamping the electrode wires into a groove of tension nut 32.

Abutments 29, housing 23 and membrane 22 are interconnected on the pressure facing side of the transducer by welding, as shown. External threading and sealing surfaces on the housing are provided for installation in the bore of the combustion chamber to be pressure measured. A lower housing part 33 is welded to the transducer housing 23, as shown. This lower part supports a teflon insulated and sealed miniature plug which comprises a teflon part 41, plug pin 42, casing 43, seal 44 and safety nut 45.

What is claimed is:

1. A pressure transducer for pressure measurement at high temperature, particularly for the combustion chamber pressure of an internal combustion engine, comprising a housing, at least two piezoelectric flat plates loaded in shear mode and arranged laterally on opposite sides of a central stamp element, pressure distribution elements bearing externally on the piezoelectric plates, abutment elements bearing externally on said pressure distribution elements, and a prestress spring element surrounding said abutment elements and applying compressive forces to said pressure distribution elements and for retaining said plates in place, said abutment elements being connected to said housing, whereby the axial force exerted against the stamp elements by pressure to be measured exerts a thrust on both said piezoelectric plates which thrust is absorbed by said abutment elements and transferred to said housing without affecting said prestress element.

2. The transducer according to claim 1, wherein said abutment elements are connected to an end of said housing confronting the pressure to be measured.

3. The transducer according to claim 1, wherein said prestress spring element is an annular bent spring, which is elastically deformed in the course of the mounting procedure.

4. The transducer according to claim 1, wherein the outer surfaces of said distribution elements are contoured such that said abutment elements linearly bear on said distribution elements in the direction of the axial force.

5. The transducer according to claim 1, wherein said central stamp element, said pressure distribution elements and said abutment elements comprise a cross section and a material for equalizing in a radial direction any expansion differences between said abutment elements and said pressure distribution elements which function together with said piezoelectric plates supported by said central stamp element.

6. The transducer according to claim 1, wherein said pressure distribution elements comprise a ceramic material for electric insulation and equalizing in a radial direction any expansion differences between said abutment elements and said piezoelectric plates which function together with said central stamp element.

7. The transducer according to claim 1, wherein said abutment elements and said pressure distribution elements are combined to form integral parts, thus economizing pressure distribution.

8. The transducer according to claim 1, wherein said piezoelectric flat plates are made of lithium niobate crystal having a cut $(xyt)_x = 20°$ to $25°$.

* * * * *